(12) United States Patent
Park et al.

(10) Patent No.: US 8,008,926 B2
(45) Date of Patent: Aug. 30, 2011

(54) UHF PARTIAL DISCHARGE AND LOCATION MEASURING DEVICE FOR HIGH-VOLTAGE POWER DEVICES

(75) Inventors: Ki-Jun Park, Daejeon (KR); Sun-Geun Goo, Daejeon (KR); Jin-Yul Yoon, Daejeon (KR); Ki-Son Han, Daejeon (KR); Hyung-Jun Ju, Daejeon (KR)

(73) Assignee: Korea Electric Power Corporation (KR)

( * ) Notice: Subject to any disclaimer, the term of this patent is extended or adjusted under 35 U.S.C. 154(b) by 292 days.

(21) Appl. No.: 12/345,261

(22) Filed: Dec. 29, 2008

(65) Prior Publication Data

US 2010/0079148 A1 Apr. 1, 2010

(30) Foreign Application Priority Data

Sep. 30, 2008 (KR) .................. 10-2008-0096004

(51) Int. Cl.
*H01H 9/50* (2006.01)
*G01R 31/08* (2006.01)
*G01S 3/80* (2006.01)

(52) U.S. Cl. ......... 324/536; 324/458; 324/613; 367/129
(58) Field of Classification Search .................. 324/536, 324/458, 613; 367/129
See application file for complete search history.

(56) References Cited

U.S. PATENT DOCUMENTS

| | | | | |
|---|---|---|---|---|
| 3,622,872 A * | 11/1971 | Boaz | ............................ | 324/536 |
| 5,117,191 A * | 5/1992 | Saigo et al. | ................... | 324/551 |
| 5,475,312 A * | 12/1995 | Sedding et al. | ................ | 324/536 |
| 5,506,511 A * | 4/1996 | Nilsson et al. | ................ | 324/553 |
| 5,691,959 A * | 11/1997 | Kriewall et al. | ............. | 367/129 |
| 6,448,782 B1 * | 9/2002 | Pakonen et al. | .............. | 324/536 |
| 7,161,873 B2 * | 1/2007 | Kuppuswamy et al. | ...... | 367/129 |
| 7,579,843 B2 * | 8/2009 | Younsi et al. | ................. | 324/458 |

\* cited by examiner

*Primary Examiner* — Jeff Natalini
(74) *Attorney, Agent, or Firm* — The Farrell Law Firm, P.C.

(57) ABSTRACT

Disclosed is a UHF partial discharge and its location measuring device for high-voltage power devices. The measuring device includes a partial discharge sensor, an external noise sensor, an analogue-digital converter, a peak detector, a partial discharge signal processor, an arrival time detector, a discharge location processor, and a display unit.

4 Claims, 6 Drawing Sheets

PRPD DURATION: 5MINUTES
CHANNEL MODE: SINGLE/MULTI (CH#)
NOISE REDUCTION: ON
NOISE GATING: ON

MEASUREMENT OF DISCHARGE LOCATION

X = 000.0+00.0mm
Y = 000.0+00.0mm
Z = 000.0+00.0mm

NUMBER OF SAMPLES: 132 SAMPLES

NOISE REDUCTION: ON
NOISE GATING: ON

UHF PARTIAL DISCHARGE AND LOCATION MEASURING DEVICE FOR HIGH-VOLTAGE POWER DEVICES

PRIORITY

This application claims priority from and the benefit of Korean Patent Application No. 10-2008-0096004, filed on Sep. 30, 2008, which is hereby incorporated by reference for all purposes as if fully set forth herein.

BACKGROUND OF THE INVENTION

1. Field of the Invention

Disclosed exemplary embodiment is directed to technologies that may receive a partial discharge signal of an ultrahigh frequency ("UHF") band through a sensor to measure the partial discharge and display the location where the partial discharge occurred in a power device.

2. Description of the Related Art

Partial discharges occur mostly in a case where there is a defect inside a high-voltage power device such as oil-immersed transformers, gas insulating transformers, reactors, etc. There has been conventionally suggested a technology for measuring such partial discharges, which measures the arrival time of a sound wave signal transmitted from a location where the partial discharge occurs to each of a number of sensors attached on a casing of a device-under-test ("DUT") through the casing or insulating material, such as transformer oil, using the sensors, calculates the arrival time when the signal arrives at each sensor or difference in arrival time, and finds the location of the partial discharge from propagation velocity of an ultraviolet signal transmitted through each medium.

However, this method may evaluate the location only when there is exactly known the propagation velocity of the sound wave in the case of the DUT, a structure, or transformer oil that functions as a path through which the sound wave propagates. Moreover a measurer needs to shift the sensors on the DUT several times to exactly evaluate the location of partial discharge, and this causes the measurer burdensome.

Furthermore, some noises may intervene due to external factors such as vibration of the power device, operations of device, wind, or the like, and therefore, evaluation of the location still needs to be done by hand to raise precision and accuracy of evaluation.

There has been another conventional method that analyzes internal errors of a high-voltage power device and finds the location of a discharge. This method yields the location of a partial discharge by measuring and analyzing a partial discharge signal generated by the discharge with a partial discharge measuring device, measuring a signal from a UHF partial discharge sensor or ultrasonic sensor with an oscilloscope to calculate the arrival time of the discharge signal, and solving optimization-related problems manually or using a computer from the arrival time of the signal or difference in arrival time.

However, this method suffers from difficulties and inconvenience in arrival time calculation and calculation method because of being done manually or using oscilloscopes or computational computers, and further has a disadvantage that it is difficult for common technicians to apply this method to a discharge that experiences real time variations.

Furthermore, this method requires the measurer to manually and separately classify noises that externally come, and to use a partial discharge meter separately from the oscilloscopes, and this leads to difficulties not capable of evaluating the location of discharge simultaneously from a partial discharge signal measured at the same sensor.

Therefore, there is a need of providing a partial discharge and partial discharge location measuring device that may overcome these problems.

SUMMARY OF THE INVENTION

According to an aspect, there is provided a UHF partial discharge and location measuring device for a high-voltage power device, which receives signals detected by UHF sensors when a partial discharge occurs due to defects inside the high-voltage power device such as transformers or reactors and simply provides a partial discharge pattern, so that a user may facilitate to analyze the partial discharge. The UHF partial discharge and location measuring device yields the location of the partial discharge from information obtained from signals simultaneously detected at several sensors, location information of each sensor inputted by the user, and information on internal structure of the power device such as transformers or reactors, and performs a statistical process on the yielded location corresponding to the number of measurements, and this enables an operator to analyze partial discharge and its location with high accuracy and simplicity so that the operator may remove the defect in the high voltage device.

According to another aspect, there is provided a UHF partial discharge and location measuring device that may reduce corona noises often generated in a substation equipped with transformers and any other various kinds of external noises caused by switching surges, or in mobile phones or wireless LANs and reduce surrounding noises to improve detection of arrival time of a partial discharge signal generated due to a defect inside a transformer and exactly measure the partial discharge signal, thus obtaining highly reliable results.

According to an exemplary embodiment, there is provided a UHF partial discharge and its location measuring device for high-voltage power devices, including: a partial discharge sensor that is attached onto a DUT (Device Under Test) to detect a partial discharge signal; an external noise sensor that is located outside the DUT to detect an external noise signal; an analogue-digital converter that receives a partial discharge signal from the partial discharge sensor and an external noise signal from the external noise sensor and digitalizes the received signals; a peak detector that extracts a peak value of the digitalized signal for each and every sensor; a partial discharge signal processor that generates a peak signal for a phase and time of a power signal, density of the peak signal for the phase of the power signal, and a long-term variation in trend of a signal from the extracted peak value for each and every sensor; an arrival time detector that detects a start point of the partial discharge signal and detects an arrival time; a discharge location processor that yields a discharge location from a location coordinate where the partial discharge sensor is positioned and the arrival time and performs a statistical process on the yielded discharge location according to the number of times of the yields; and a display unit that displays the peak signal, the density, the variation in trend, and the discharge location.

The UHF partial discharge and its location measuring device for high-voltage power devices may further include a noise reducer that reduces or removes noises from the digitalized partial discharge signal.

The noise reducer may remove a noise signal measured at the partial discharge sensor and reduce a noise signal other than the partial discharge signal from the digitalized partial discharge signal in a case where the magnitude of the external noise signal is equal to or larger than a magnitude preset by a user.

The discharge location processor may calculate each distance by multiplying the arrival time by signal transmission velocity and determine the intersection of circular trajectories, each of which corresponds to the distance, as a position where the partial discharge occurs.

In a case where the position where the partial discharge occurs is determined as a no-discharge-occur location, another location closest to the detected discharge location, where any discharge may occur, may be displayed as well.

As described above, the UHF partial discharge and its location measuring device for high-voltage power devices according to the exemplary embodiment processes signals detected at UHF partial discharge sensors attached to a high-voltage electric device such as transformers or reactors to enable a user to easily analyze a partial discharge and display the location of the partial discharge together with the analyzed results in real time.

Accordingly, such inconvenience may be removed that a measurer measures the arrival time using an oscilloscope and a location evaluation optimization program to evaluate the location of a partial discharge.

As a consequence, the exemplary embodiment may provide a method that allows an operator of a substation to easily find and monitor internal errors and faults in a high-voltage electric device such as transformers or reactors, and take necessary steps.

And, the UHF partial discharge and its location measuring device for high-voltage power devices according to the exemplary embodiment may remove external noises by its noise removing means to prevent external noises that may cause wrong results from coming to the partial discharge sensors attached to the electric device and reduce background noises to give birth to more accurate and precise measurement results of the partial discharge and its location.

BRIEF DESCRIPTION OF THE DRAWINGS

The above and other features of the present disclosure will be described in reference to certain exemplary embodiments thereof with reference to the attached drawings in which.

DETAILED DESCRIPTION OF THE PREFERRED EMBODIMENTS

Figure 1:
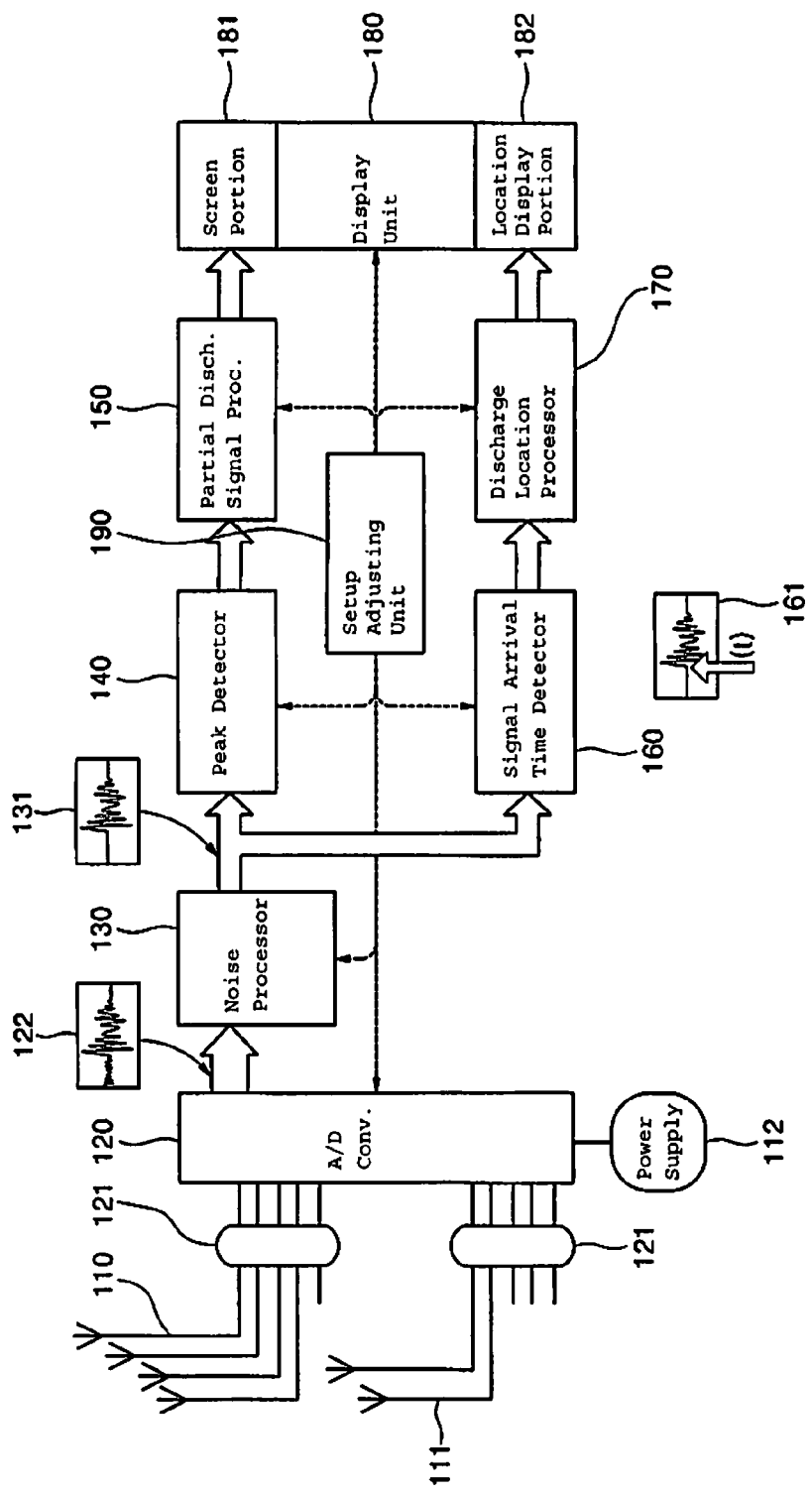
FIG. 1 is a block diagram illustrating a UHF partial discharge and its location measuring device for high-voltage power devices according to an exemplary embodiment.

Reference will now be made in detail to exemplary embodiments, examples of which are illustrated in the accompanying drawings, wherein like reference numerals refer to the like elements throughout. The embodiments are described below in order to explain the present disclosure by referring to the figures.

FIG. 1 is a block diagram illustrating a UHF partial discharge and its location measuring device for a high voltage power device according to an exemplary embodiment.

Referring to FIG. 1, the UHF partial discharge and its location measuring device includes a UHF partial discharge sensor 110, an external noise sensor 111, a high pass filter 121, an analog-digital converter 120, a power supply 112, a noise processor 130, a peak detector 140, a partial discharge signal processor 150, a signal arrival time detector 160, a discharge location processor 170, a display unit 180, and a setup adjusting unit 190.

The UHF partial discharge sensor 110 is attached to a DUT which is subjected to measurement of a partial discharge and its location to detect any partial discharge signal.

The partial discharge signal detected by the UHF partial discharge sensor 110 passes the high pass filter 121 for surge protection through a co-axial signal line having the same delay time and is inputted to the analog-digital converter 120.

The external noise sensor 111 is installed outside the DUT to capture and transmit surrounding noises signals to the analog-digital converter 120 through the co-axial signal line.

An AC power signal with the same phase as that of a voltage applied to the DUT is also inputted from the power supply 112 to the analog-digital converter 120. The overall signals inputted to the analog-digital converter 120 are digitalized in phase synchronization with a signal from the power supply 112, inputted to and processed by the noise processor 130, and supplied to the peak detector 140 and the signal arrival time detector 160.

The peak detector 140 extracts the peak value from the digitalized signal for each sensor and transmits it to the partial discharge signal processor 150.

The partial discharge signal processor 150 generates a peak signal (PRPS) for phase and time of the power signal necessary for partial discharge analysis, density (PRPD) of the peak signal for phase of the power signal, and long-term variation in trend of a signal (Trend) and transmits them to the display unit 180.

The screen portion 181 of the display unit 180 outputs the PRPS, the PRPD, and the Trend.

The signal arrival time detector 160 detects a start point 161 of the partial discharge signal that has passed through the noise processor 130 from each partial discharge sensor 110 and transfers the start point 161 to the discharge location processor 170.

The discharge location processor 170 yields the location of the partial discharge from the coordinate of the location where the UHF partial discharge sensor 110 is positioned, which is inputted by a user, and arrival time of the partial discharge signal detected by each partial discharge sensor 110, and performs a statistical process on the yielded location, for example, such a process as calculating the mean value and standard deviation, according to the number of yields, and then displays the result on the location display portion 182 of the display unit 180.

The setup adjusting unit 190 adjusts functions and setups of each constitutional element according to the values set by the user. More specifically, the setup adjusting unit 190 adjusts triggering size, bandwidth, sampling interval of the analog-digital converter 120 as well as the magnitude of a noise-removal signal and degree of noise reduction of the noise processor 130.

In addition, the setup adjusting unit 190 sets the detection sensitivity of the signal arrival time detector 160, accumulating time, measuring time, and number of times of the partial discharge signal processor 150, and the number of statistical populations of the discharge location processor 170.

Hereinafter, an operation of a UHF partial discharge and its location measuring device for high-voltage power devices having the above configuration according to an exemplary embodiment will be described with reference to FIGS. 2 to 6.

Figure 2:
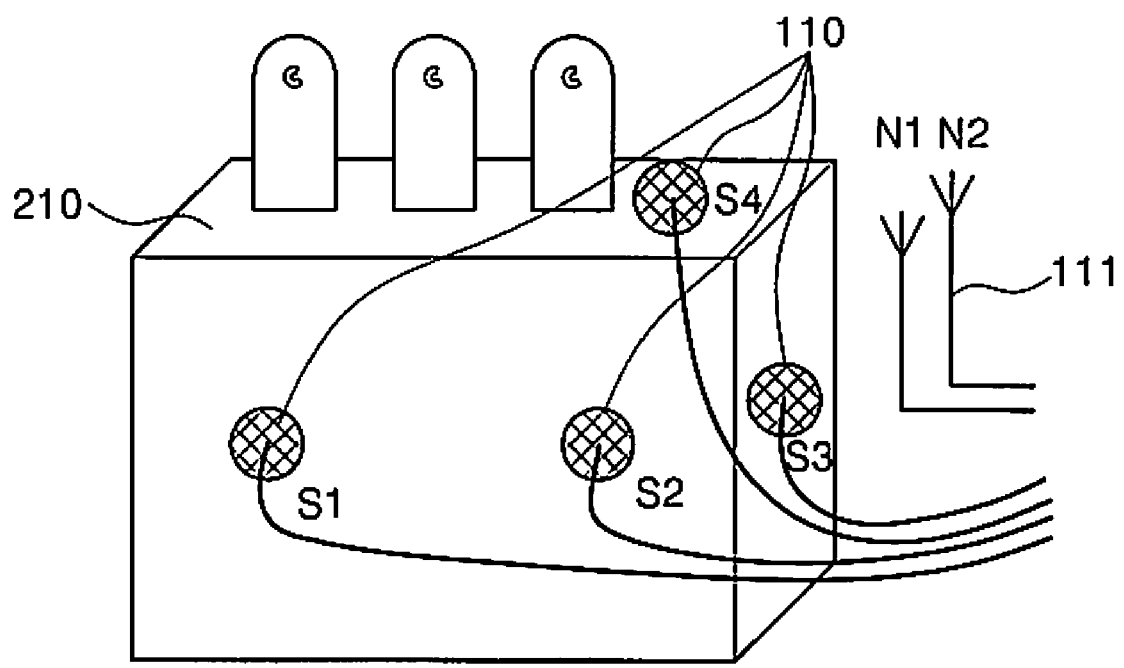
FIG. 2 is a view illustrating a state where plural partial discharge sensors and external noise sensors are attached to a transformer in the UHF partial discharge and its location measuring device for high-voltage power devices according to an exemplary embodiment.
Figure 3:
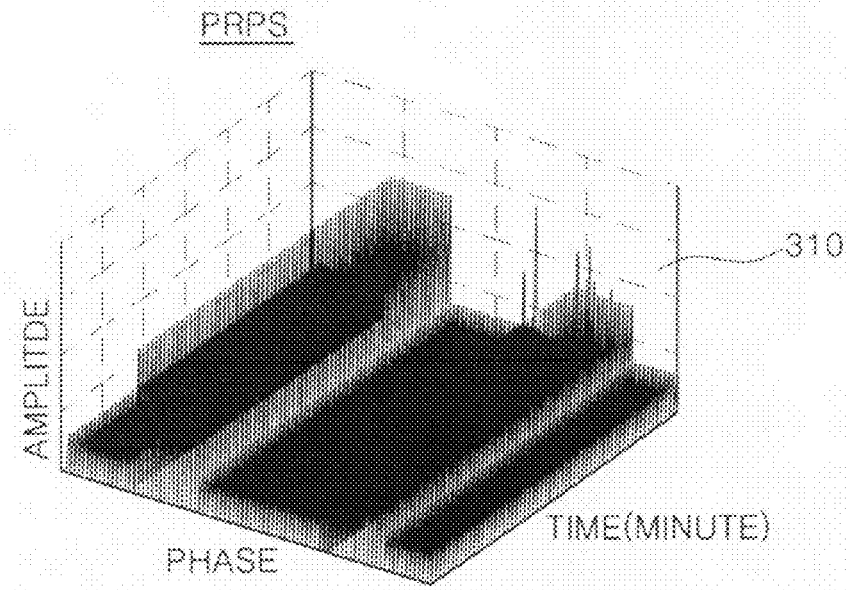
FIG. 3 is a view illustrating displaying a PRPS, a PRPD, and a Trend on a display unit in the UHF partial discharge and its location measuring device for high-voltage power devices according to an exemplary embodiment.
Figure 3:
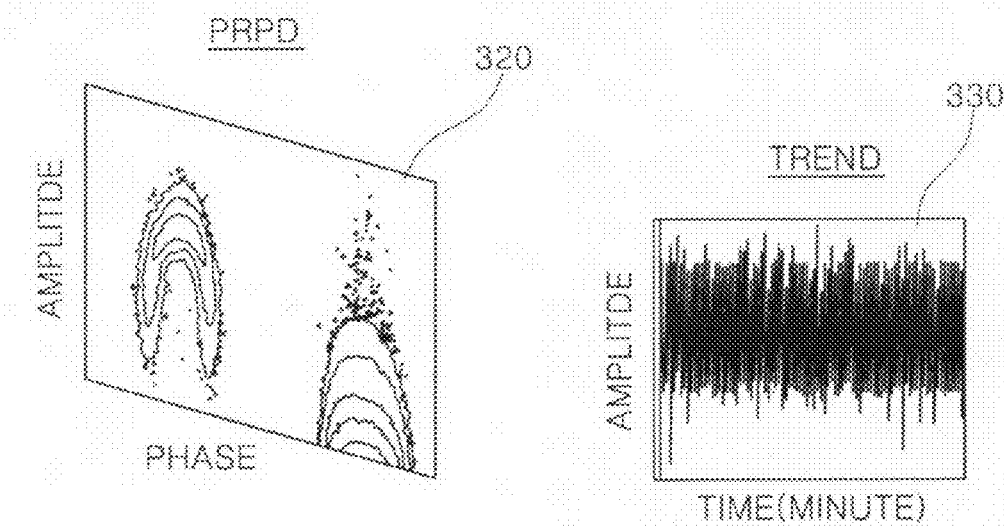
Figure 4:
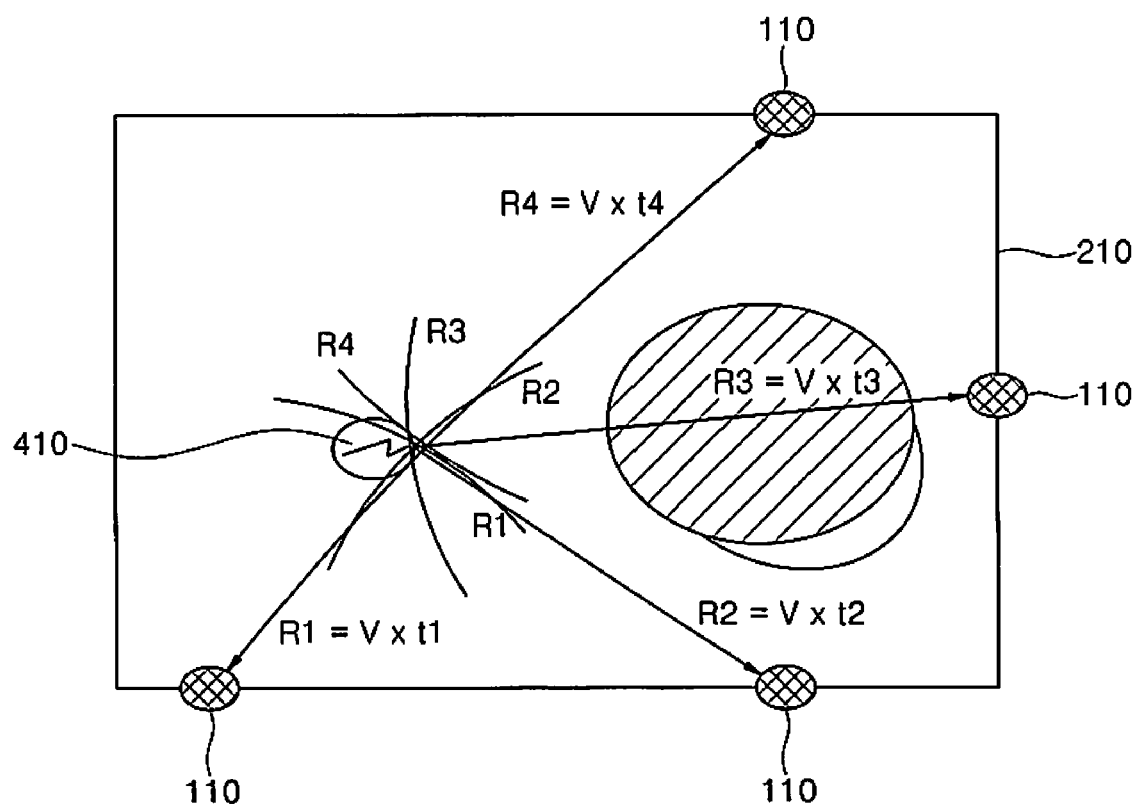
FIG. 4 is a view illustrating measuring the location of a partial discharge from the partial discharge sensors by drawing circular trajectories.
Figure 5:
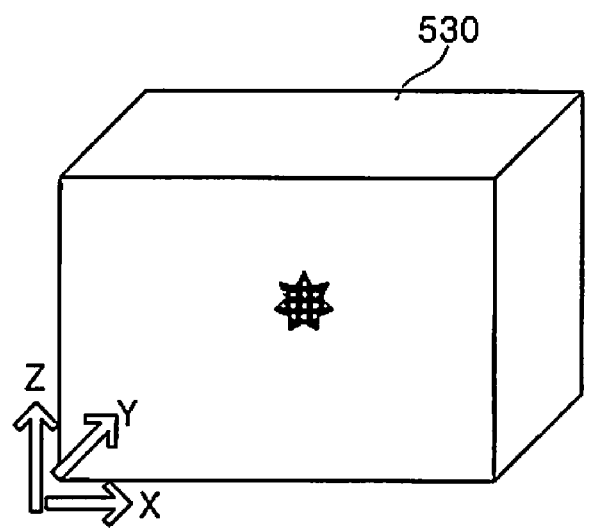
FIG. 5 is a view illustrating displaying the schematic shape of a DUT and the location of a partial discharge on the display unit in the UHF partial discharge and its location measuring device for high-voltage power devices according to an exemplary embodiment.
Figure 6:
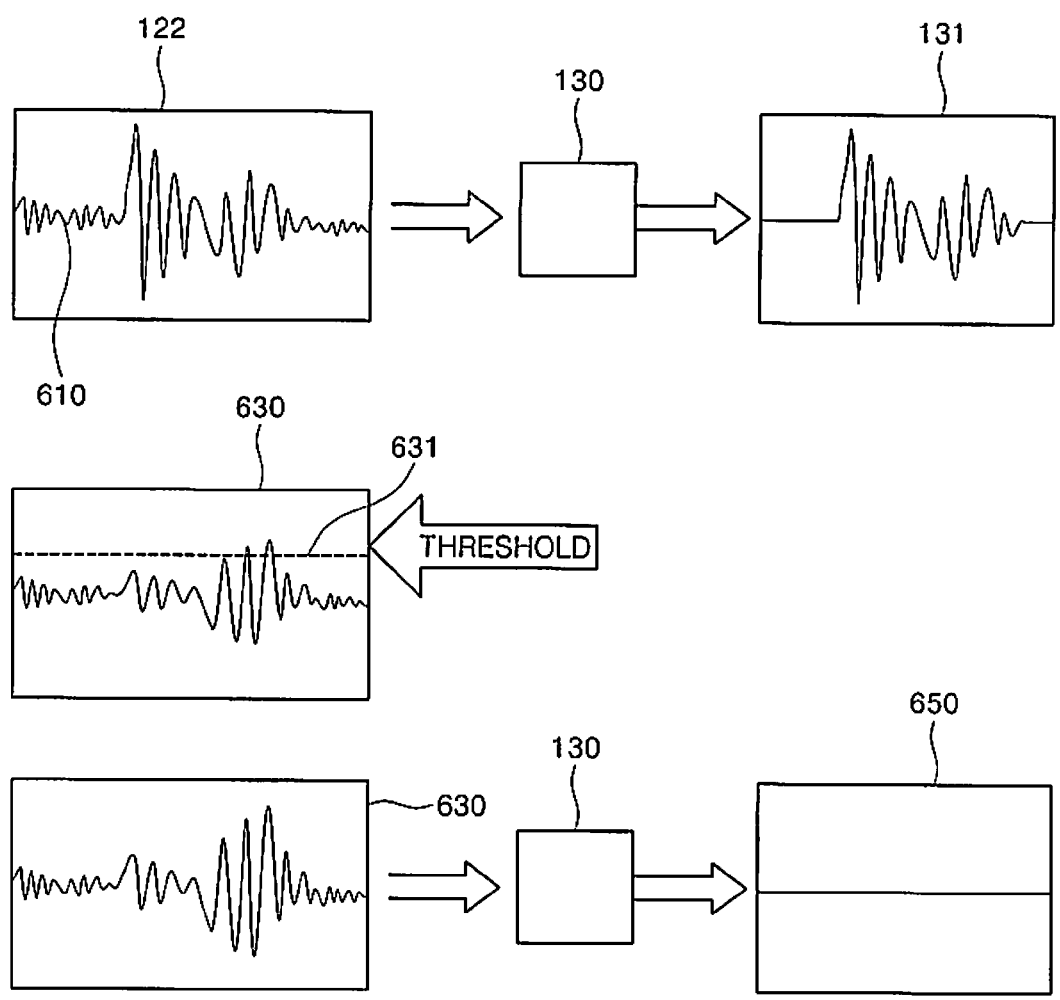
FIG. 6 is a view illustrating signals passing through components included in the UHF partial discharge and its location measuring device for high-voltage power devices shown in FIG. 1.

FIG. 2 is a view illustrating a state where plural partial discharge sensors and external noise sensors are attached to a transformer in the UHF partial discharge and its location measuring device for high-voltage power devices according to an exemplary embodiment, FIG. 3 is a view illustrating displaying a PRPS, a PRPD, and a Trend on a display unit in the UHF partial discharge and its location measuring device for high-voltage power devices according to an exemplary embodiment, FIG. 4 is a view illustrating measuring the location of a partial discharge from the partial discharge sensors by drawing circular trajectories, FIG. 5 is a view illustrating displaying the schematic shape of a DUT and the location of a partial discharge on the display unit in the UHF partial discharge and its location measuring device for high-voltage power devices according to an exemplary embodiment, and FIG. 6 is a view illustrating signals passing through components included in the UHF partial discharge and its location measuring device for high-voltage power devices shown in FIG. 1.

Referring to FIG. 2, firstly, the UHF partial discharge sensor 110 positioned at a DUT such as the transformer 210 and the external noise sensor 111 positioned around the DUT, respectively, detect a partial discharge signal and an external noise signal and transmit them to a high pass filter 121.

The high pass filter 121 blocks DC components and low-frequency components from the transmitted signals to protect the partial discharge and its location measuring device from an external surge.

The partial discharge signal and the external noise signal that have passed through the high pass filter 121 are inputted to the analog-digital converter 120.

The analog-digital converter 120 captures the signals simultaneously through the whole channels in a case where the inputted signals have a larger value than a value preset by the user, digitalizes the captured signals, and then inputs the digitalized signals to the noise processor 130.

In a case where the magnitude of the signal 630 measured by the external noise sensor 111 is larger than the threshold 631 preset by the user and any signal is measured by the partial discharge sensor, the noise processor 130 removes the signals like the signal 650 shown in FIG. 6.

And, the noise processor 130 removes background noises 610 from the inputted signal 122 and supplies it to the peak detector 140 and the signal arrival time detector 160. This enables detect the arrival time more easily and accurately as well as display the partial discharge signal more precisely.

The peak detector 140 detects the peak value of the inputted signal 131 or 650 and transfers the detected peak value to the partial discharge signal processor 150. For this case, the peak detector 140 may sum the values measured at the overall partial discharge sensors to raise the detection sensitivity of the partial discharge according to user's setup.

The partial discharge signal processor 150 processes the peak data in association with a period or accumulating number preset by the user and displays the result on the screen portion 181 of the display unit 180 in such a manner that represents data as a peak signal 310 for phase and time of the power signal (PRPS: Phase Resolved Pulse Sequence), density 320 of the peak signal for phase of power signal (PRPD: Phase Resolved Partial Discharge), and a variation in trend 330 (Trend) for a preset period as illustrated above with reference to FIG. 3.

The signal arrival time detector 160 detects the start point or end point 161 ($t$) of a signal from each sensor and transfers the result to the discharge location processor 170.

The arrival time of a signal is when the magnitude of supplied signal becomes larger than a value preset by the user or its slope starts to be changed (161).

The discharge location processor 170 calculates the distance between each partial discharge sensor and the position 410 where the partial discharge occurs by multiplying the arrival time by the propagation velocity of the signal as shown in FIG. 4 from the location coordinate where the UHF partial discharge sensor 110 is positioned, which is inputted by the user, and the arrival time of the signal detected by each sensor. The discharge location processor 170 determines the intersection of circular trajectories, each of which corresponds to the distance, as the position 410 where the partial discharge occurs. Or, the discharge location processor 170 may find the position 410 by calculating difference in the arrival time of signals from the sensors to solve a linear equation regarding locations of the sensors and the difference in the arrival time using a Time Difference of Arrival (TDOA) method.

The propagation velocity of the discharge signal is inputted by the user depending on insulation medium of the DUT. X, Y, and Z coordinates of the discharge location which has been yielded whenever the discharge takes place are subjected to a statistical process as many numbers of time as preset by the user to produce average, standard deviation, and range of the X, Y, and Z coordinates, which are then displayed on the display unit 180 as shown in FIG. 5.

For the user's convenience, the discharge location may be pinpointed in a virtual structure 530 that has the similar shape to the actual DUT as shown in FIG. 5. When the detected discharge location is marked within a "no-discharge-occur area" which is inputted by the user, wherein the "no-discharge-occur" means where no discharge may occur, this appears on the location display portion 182 of the display unit 180 and another location closest to the detected discharge location, where any discharge may occur, is displayed as well.

The display unit 180 shows both a partial discharge signal analysis screen 181 and a partial discharge location evaluation result 182 that are results processed from the same partial discharge signal 122. And, the display unit 180 updates the two screens in real time whenever a partial discharge signal is newly detected by and inputted to the sensor.

Although the present disclosure has been described with reference to certain exemplary embodiments thereof, it will be understood by those skilled in the art that a variety of modifications and variations may be made to the present disclosure without departing from the spirit or scope of the present disclosure defined in the appended claims, and their equivalents.

What is claimed is:

1. A UHF partial discharge and location measuring device for high-voltage power devices, the device comprising:
   a partial discharge sensor attached to a Device Under Test (DUT) to detect a partial discharge signal;
   an external noise sensor located outside the DUT to detect an external noise signal;

an analogue-digital converter that receives a partial discharge signal from the partial discharge sensor and an external noise signal from the external noise sensor and digitalizes the received signals;
a peak detector that extracts a peak value of the digitalized signal for each sensor;
a partial discharge signal processor that generates a peak signal for a phase and time of a power signal applied to the DUT, density of the peak signal for the phase of the power signal applied to the DUT, and a long-term variation in trend of the partial discharge signal from the extracted peak value for each sensor;
an arrival time detector that detects a start point of the partial discharge signal and detects an arrival time;
a discharge location processor that yields a discharge location from a location coordinate where the partial discharge sensor is positioned and the arrival time and performs a statistical process on the yielded discharge location according to a number of yield times; and
a display unit that displays the peak signal, the density, the variation in trend, and the discharge location.

2. The UHF partial discharge and location measuring device for high-voltage power devices of claim 1, wherein a noise processor removes a noise signal measured at the partial discharge sensor and reduces a noise signal other than the partial discharge signal from the digitalized partial discharge signal in a case where the magnitude of the external noise signal is equal to or larger than a magnitude preset by a user.

3. The UHF partial discharge and location measuring device for high-voltage power devices of claim 2, wherein the discharge location processor calculates each distance by multiplying the arrival time by signal transmission velocity and determines an intersection of circular trajectories, each of which corresponds to the distance, as a position where the partial discharge occurs.

4. The UHF partial discharge and location measuring device for high-voltage power devices of claim 3, wherein when the position where the partial discharge occurs is determined as a no-discharge-occur location, another location closest to the detected discharge location, where any discharge may occur, is also displayed.

* * * * *